United States Patent
Hoshino et al.

(10) Patent No.: US 8,130,808 B2
(45) Date of Patent: Mar. 6, 2012

(54) TWO DIMENSIONAL PHOTONIC CRYSTAL SURFACE EMITTING LASER

(75) Inventors: Katsuyuki Hoshino, Tokyo (JP); Yasuhiro Nagatomo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/957,554

(22) Filed: Dec. 1, 2010

(65) Prior Publication Data
US 2011/0134941 A1 Jun. 9, 2011

(30) Foreign Application Priority Data
Dec. 9, 2009 (JP) ................................ 2009-279087

(51) Int. Cl.
- H01S 5/00 (2006.01)
- H01S 3/097 (2006.01)
- H01S 3/08 (2006.01)

(52) U.S. Cl. ......... 372/50.124; 372/87; 372/92; 372/98; 372/102

(58) Field of Classification Search ............. 372/50.124, 372/87, 92, 98, 102
See application file for complete search history.

(56) References Cited

U.S. PATENT DOCUMENTS
7,499,480 B2  3/2009 Nagatomo ............... 372/50.124
(Continued)

FOREIGN PATENT DOCUMENTS
JP   2003-273456 A   9/2003

OTHER PUBLICATIONS

K. Hiramatsu et al., "Fabrication and characterization of low defect density GaN using facet-controlled epitaxial lateral overgrowth (FACELO)," Journal of Crystal Growth, vol. 221, p. 316-326 (2000).

*Primary Examiner* — Jessica Stultz
*Assistant Examiner* — Phillip Nguyen
(74) *Attorney, Agent, or Firm* — Fitzpatrick, Cella, Harper & Scinto

(57) ABSTRACT

Provided is a two-dimensional photonic crystal surface emitting laser which can suppress light leaking outside in an in-plane direction of the two-dimensional photonic crystal and an absorption loss in an active layer caused by the latter layer serving as an absorbing layer without contributing to light emission, and can improve light use efficiency. The surface emitting laser has a laminated structure in which an active layer and a photonic crystal layer are laminated in a vertical direction, has a resonance mode in an in-plane direction of the photonic crystal, and light is extracted in a vertical direction to a surface of the photonic crystal, wherein the laminated structure has a multi-refractive index layer including a central region made of a high refractive index medium and a peripheral portion made of a low refractive index medium with a lower refractive index than that of the high refractive index medium.

8 Claims, 5 Drawing Sheets

U.S. PATENT DOCUMENTS

| | | | |
|---|---|---|---|
| 7,535,946 B2 | 5/2009 | Nagatomo et al. | 372/50.124 |
| 7,664,158 B2 * | 2/2010 | Kiyota | 372/96 |
| 7,796,666 B2 | 9/2010 | Nagatomo | 372/50.124 |
| 7,869,483 B2 | 1/2011 | Uchida et al. | 372/99 |
| 7,978,745 B2 * | 7/2011 | Noda et al. | 372/50.11 |
| 2008/0298419 A1 * | 12/2008 | Hori et al. | 372/50.124 |
| 2009/0074026 A1 | 3/2009 | Nagatomo et al. | 372/50.124 |
| 2009/0168829 A1 * | 7/2009 | Kise et al. | 372/50.124 |
| 2009/0225805 A1 | 9/2009 | Nagatomo | 372/99 |
| 2010/0092800 A1 | 4/2010 | Itagaki et al. | 428/697 |

* cited by examiner

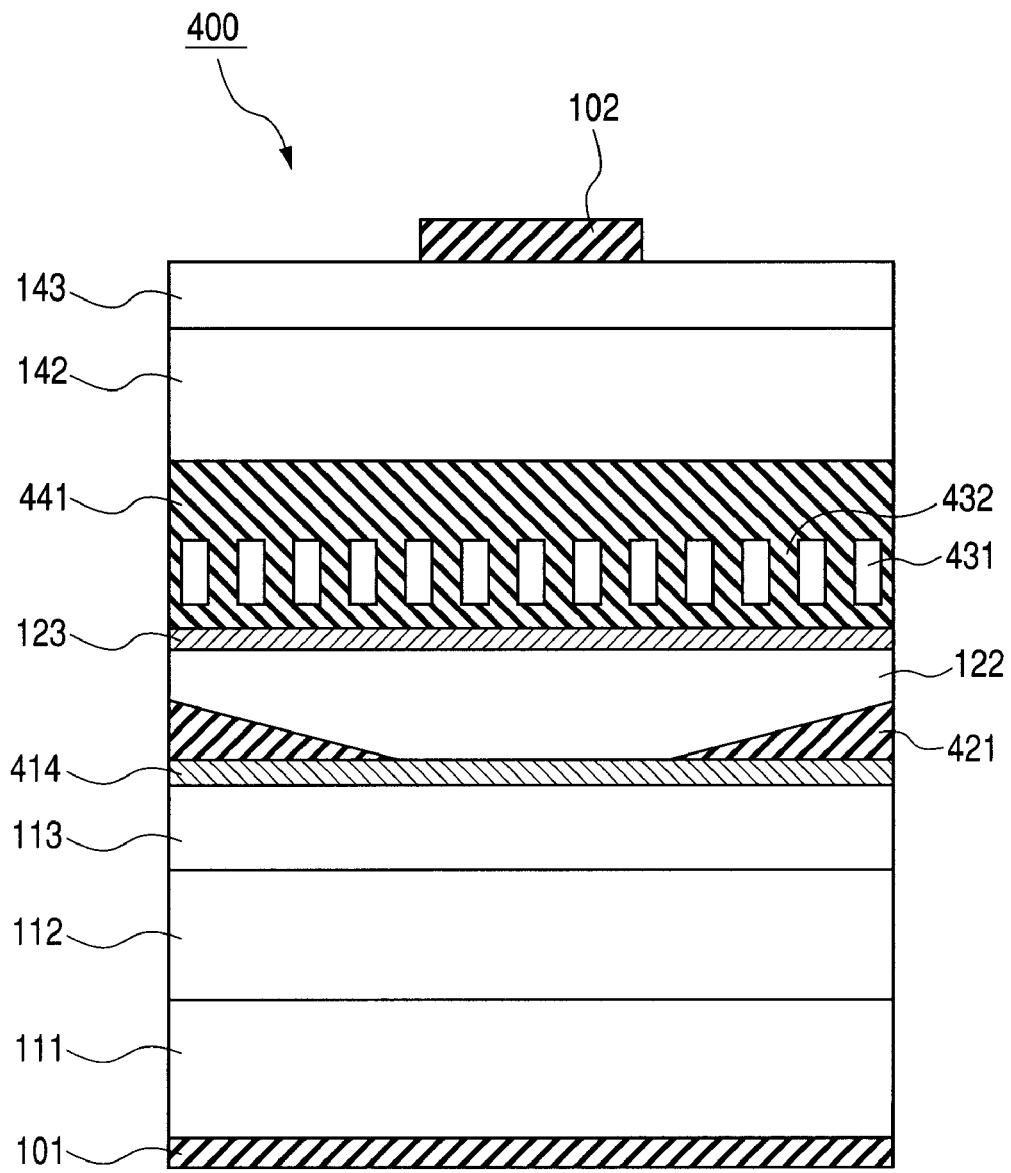

TWO DIMENSIONAL PHOTONIC CRYSTAL SURFACE EMITTING LASER

BACKGROUND OF THE INVENTION

1. Field of the Invention

The present invention relates to a distributed feedback type surface emitting laser using a two-dimensional photonic crystal.

2. Description of the Related Art

There has been known a surface emitting laser which uses a two-dimensional photonic crystal as a reflecting mirror, configures the two-dimensional photonic crystal itself as a laser resonator, generates laser amplification in a horizontal direction (in-plane direction), and extracts light in a vertical direction to a crystal surface thereof.

In particular, in a surface emitting laser using a nitride semiconductor which can emit light in the near-ultraviolet to green range, it is difficult to manufacture a commonly used distributed Bragg reflector, and thus a surface emitting laser using a two-dimensional photonic crystal has been actively studied.

As such a two-dimensional photonic crystal surface emitting laser, in order to improve light use efficiency, Japanese Patent Application Laid-Open No. 2003-273456 discloses a surface emitting laser which provides a light-reflecting region, around a periphery of the two-dimensional photonic crystal in a horizontal direction to the crystal surface thereof, in a vertical direction to a crystal surface of the two-dimensional photonic crystal.

According to this configuration, part of the light which attempts to leak outside in the horizontal direction (in-plane direction) from the two-dimensional photonic crystal is reflected inside by the light-reflecting region, which is expected to improve light use efficiency.

SUMMARY OF THE INVENTION

As described above, according to the two-dimensional photonic crystal surface emitting laser having the light-reflecting region disclosed in Japanese Patent Application Laid-Open No. 2003-273456, part of the light which attempts to leak outside in the in-plane direction from the two-dimensional photonic crystal is reflected inside by the light-reflecting region to improve light use efficiency.

Meanwhile, in order to oscillate the above two-dimensional photonic crystal surface emitting laser, an electrode needs to be provided on part of the laser surface in a region overlapped with the two-dimensional photonic crystal, and from the electrode carriers need to be injected into the active layer.

At this time, the electrode provided on the part of the laser surface has a low transmittance and absorbs a laser beam. Thus, the laser beam which resonates in the two-dimensional photonic crystal is extracted from the laser from around the electrode.

Meanwhile, a p-type conductive layer has a high resistance in comparison with an n-type conductive layer. In particular, in a nitride semiconductor, current does not easily spread other than near the p-type conductive layer immediately under the p-type electrode.

More specifically, when an electrode is placed in a central region of the photonic crystal, only an active layer region in the central region immediately or nearly immediately under the p-type electrode becomes a light-emitting region.

Carriers are not injected into the other active layer region in the peripheral portion thereof, and hence the region does not contribute to light emission, but on the contrary serves as an absorbing layer, thus causing a problem of increasing losses.

In view of the above problem, an object of the present invention is to provide a two-dimensional photonic crystal surface emitting laser which can suppress a loss of light leaking outside in the in-plane direction of the two-dimensional photonic crystal and an absorption loss in an active layer caused by serving as an absorbing layer without contributing to light emission; and to improve light use efficiency.

In view of the above problem, the two-dimensional photonic crystal surface emitting laser of the present invention includes a laminated structure in which an active layer and a photonic crystal layer having a photonic crystal structure are laminated on a substrate in a vertical direction to a surface of the substrate. The laser has a resonance mode in an in-plane direction of the photonic crystal, and light is extracted in a vertical direction to a surface of the photonic crystal. The laminated structure has a multi-refractive index layer including a central region having a high refractive index medium and a peripheral portion having a low refractive index medium with a lower refractive index than that of the high refractive index medium.

The present invention can provide a two-dimensional photonic crystal surface emitting laser which can suppress loss of light leaking outside in the in-plane direction of the two-dimensional photonic crystal and an absorption loss in an active layer caused by the active layer serving as an absorbing layer without contributing to light emission, thus improving light use efficiency.

Further features of the present invention will become apparent from the following description of exemplary embodiments with reference to the attached drawings.

BRIEF DESCRIPTION OF THE DRAWINGS

FIG. 4 is a sectional view describing a two-dimensional photonic crystal surface emitting laser according to another configuration example of example 1 of the present invention.

DESCRIPTION OF THE EMBODIMENTS

Preferred embodiments of the present invention will now be described in detail in accordance with the accompanying drawings.

Figure 1A:
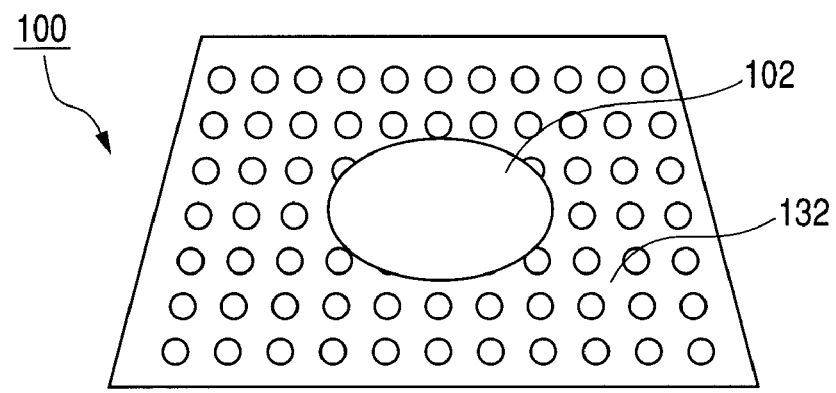
FIGS. 1A and 1B are a schematic perspective view and a sectional view describing a configuration example of a two-dimensional photonic crystal surface emitting laser according to an embodiment of the present invention.
Figure 1B:
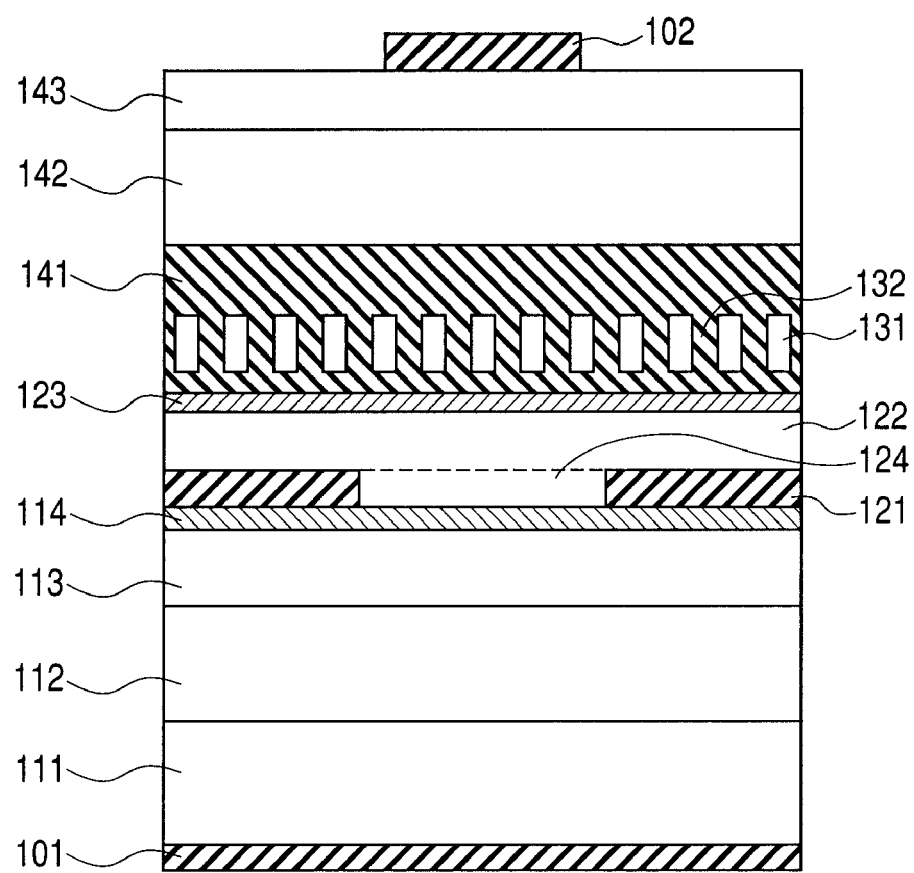

By referring to FIGS. 1A and 1B, the description focuses on a two-dimensional photonic crystal surface emitting laser 100 of a laminated structure including a photonic crystal layer having a photonic crystal structure according to an embodiment of the present invention.

In FIG. 1B, the two-dimensional photonic crystal surface emitting laser 100 includes a lower contact layer 111, a lower cladding layer 112, a lower optical guide layer 113, and an active layer 114. Further, the two-dimensional photonic crystal surface emitting laser 100 includes a low refractive index medium 121, an upper optical guide layer 122 containing the low refractive index medium 121, and an electron blocking layer 123; a two-dimensional photonic crystal 132, an optical guide layer 141 containing the two-dimensional photonic crystal 132, an upper cladding layer 142, and an upper contact layer 143; and electrodes 101 and 102.

Here, the description focuses on a process of manufacturing the upper optical guide layer 122 containing the low refractive index medium 121.

The active layer 114 is formed, and then the low refractive index medium 121 made of, for example, silicon dioxide (with a refractive index of 1.5) and having an aperture part is formed on the active layer 114. Note that the aperture part can be formed into various forms such as a circle, a hexagon, and a quadrangle.

Then, a thin film semiconductor layer is grown on the active layer 114 on which the low refractive index medium 121 is formed by the MOCVD process or the MBE process as follows. More specifically, a thin film semiconductor layer made of a medium with a higher refractive index than that of the low refractive index medium 121 such as p-type GaN is grown from a place where the low refractive index medium 121 is not formed. Then, the upper optical guide layer 122 containing the low refractive index medium 121 is formed by burying the low refractive index medium 121 therein. Thus, a multi-refractive index layer can be formed in the laminated structure so as to include a central region having the high refractive index medium 124 and a peripheral portion having a low refractive index medium 121 with a lower refractive index than that of the high refractive index medium 124.

Such a structure can be formed under growth conditions for promoting lateral growth as disclosed in *Journal of Crystal Growth*, Vol. 221, pp. 316-326, 2000 such as by setting a growth pressure of 300 Ton and a growth temperature of 1050° C.

According to the present example, the active layer 114 and the low refractive index medium 121 are arranged close to each other, but the active layer 114 and the low refractive index medium 121 may be spaced apart from each other. In this case, the active layer 114 is formed and then a thin film semiconductor layer made of, for example, p-type GaN is grown with a necessary film thickness.

Thus, the distance between the low refractive index medium 121 and the active layer 114 can be arbitrarily set by forming the low refractive index medium 121 after part of the upper optical guide layer 122 is formed.

Now, the description focuses on the process of manufacturing the optical guide layer 141 containing the two-dimensional photonic crystal 132.

First, a thin film semiconductor layer is grown so as to form the two-dimensional photonic crystal 132. More specifically, a thin film semiconductor layer made of, for example, p-type GaN is grown with a film thickness corresponding to the height of the photonic crystal periodic structure 131.

Then, a two-dimensional photonic crystal-shaped resist that is arranged two-dimensionally and periodically in the in-plane direction by electron beam exposure and having a resonance mode in an in-plane direction is formed on the thin film semiconductor layer.

Then, the thin film semiconductor layer is dry-etched by using the resist as a mask. Subsequently, the two-dimensional photonic crystal 132 is formed by removing the resist.

Then, the optical guide layer 141 containing the two-dimensional photonic crystal 132 is formed by laminating the thin film semiconductor layer made of, for example, p-type GaN so as to cover the photonic crystal periodic structure 131.

Such a structure can be formed under predetermined growth conditions for promoting lateral growth as disclosed in the above *Journal of Crystal Growth*, Vol. 221, pp. 316-326, 2000 such as by setting a growth pressure of 300 Ton and a growth temperature of 1050° C.

According to the present embodiment, the position of the two-dimensional photonic crystal 132 in the optical guide layer 141 can be arbitrarily set. In this case, a thin film semiconductor layer is grown by adding a film thickness required to move the position of the two-dimensional photonic crystal 132 upward. Thus, the position can be arbitrarily set by forming the two-dimensional photonic crystal 132 afterward.

Note that according to the present example, the two-dimensional photonic crystal 132 is formed by dry-etching using a resist as a mask. However, for example, silicon dioxide may be used as the mask. More specifically, a silicon dioxide film is formed and then a two-dimensional photonic crystal-shaped resist that is arranged two-dimensionally and periodically in the in-plane direction and having a resonance mode in an in-plane direction is formed on the silicon dioxide film.

Then, the silicon dioxide film is dry-etched by using the resist as a mask. Thereby, a silicon dioxide film with a shape of the two-dimensional photonic crystal is formed. Subsequently, the two-dimensional photonic crystal 132 may be formed by dry-etching the thin film semiconductor layer using the silicon dioxide film as a mask.

Now, the description focuses on effects of the low refractive index medium 121 on surface emitting laser characteristics. By referring to FIG. 1B, in the peripheral portion of the surface emitting laser 100 in which the low refractive index medium 121 is formed, an effective refractive index of a waveguide containing the two-dimensional photonic crystal 132 is reduced in comparison with in an aperture part of the low refractive index medium, namely, the central region in which the high refractive index medium 124 is formed. Thus, light can be confined in the aperture part of the low refractive index medium 121 in an in-plane direction of the waveguide.

As described above, the aperture part of the low refractive index medium 121 contributing to an optical confinement effect using a difference in refractive index acts in the same manner as the aperture part of a current confinement layer in a conventional vertical cavity surface emitting laser using a distributed Bragg reflector as a resonator.

However, when the low refractive index medium 121 is compared with the current confinement layer in the conventional surface emitting laser using the distributed Bragg reflector as the resonator, the difference lies in that the conventional current confinement layer is made of an insulation medium, but the low refractive index medium of the present embodiment 121 may not be made of an insulation medium.

According to the present embodiment, p-type GaN has a high resistance and thus current injected from the p-type electrode 102 flows only near immediately under the p-type electrode 102 and is unlikely to spread laterally. In other word, a carrier is injected only in an active layer region near immediately under the p-type electrode 102 which becomes a light-emitting region.

Therefore, the low refractive index medium 121 need not have a current confinement effect and thus is not necessarily be made of an insulation medium.

The present inventors have found that the region in which the low refractive index medium 121 is formed has not only the above described optical confinement in an in-plane direction, namely, a lateral optical confinement effect but also an increase in optical confinement to a layer of the two-dimensional photonic crystal 132, namely, a vertical optical confinement effect.

As described above, in a region of the peripheral portion of the p-type electrode 102, namely, in the region in which the low refractive index medium 121 is formed, no carrier is injected in the active layer, which serves as an absorbing layer, thereby increasing optical losses.

In contrast to this, the present inventors have found that, while the formation of the low refractive index medium 121 can reduce the light distribution to the active layer in a light distribution in a waveguide inside the laser, it can increase the light distribution to a layer of the two-dimensional photonic crystal 132.

Thus, the two-dimensional photonic crystal 132 can increase light contributing to resonance by suppressing optical losses caused by the active layer serving as the absorbing layer.

In order to confirm the effect of the low refractive index medium on a light distribution inside the surface emitting laser, a simulation was performed on an electric field distribution of a waveguide mode inside the surface emitting laser 100 illustrated in FIGS. 1A and 1B.

Calculations were performed by setting the film thickness, the refractive index, and like of each layer as follows. It was set that the lower cladding layer 112 has a thickness of 600 nm; the lower optical guide layer 113 has a thickness of 80 nm; the upper optical guide layer 122 has a thickness of 100 nm; and the electron blocking layer 123 has a thickness of 20 nm. Further, it was set that the optical guide layer 141 containing the two-dimensional photonic crystal 132 has a thickness of 200 nm; the upper cladding layer 142 has a thickness of 200 nm; and the upper contact layer 143 has a thickness of 50 nm. Furthermore, it was set that the two-dimensional photonic crystal 132 has a hole diameter of 56 nm and a hole depth of 80 nm; and the two-dimensional photonic crystal 132 has a period of 160 nm.

Moreover, the upper electrode was set to cover the entire surface of the upper contact layer 143 and the upper electrode was set to have a thickness of 50 nm.

The uppermost portion of the hole was set to be in the middle of the optical guide layer 141.

Moreover, the refractive indices were set such that the lower cladding layer 112 and the upper cladding layer 142 have a refractive index of 2.49; and the lower optical guide layer 113, the upper optical guide layer 122, the upper contact layer 143, and the optical guide layer 141 containing the two-dimensional photonic crystal 132 have a refractive index of 2.55. Further, the refractive indices were set such that the active layer 114 has a refractive index of 2.62; the hole of the two-dimensional photonic crystal 132 has a refractive index of 1.0; and the low refractive index medium 121 has a refractive index of 1.5.

Figure 2A:
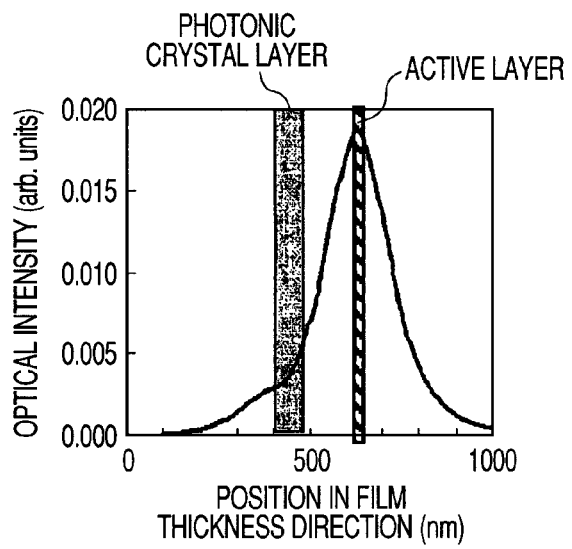
FIGS. 2A, 2B, and 2C illustrate results of calculating an optical intensity distribution using a film thickness of a low refractive index medium as a parameter according to an embodiment of the present invention.

FIG. 2A illustrates the calculation results when the low refractive index medium 121 is not formed in FIG. 1B. FIG. 2A illustrates the optical intensity distribution inside the surface emitting laser; and the gray and shaded boundary portions indicate the respective positions of the two-dimensional photonic crystal 132 and the active layer 114.

Here, the position of the uppermost surface of the surface emitting laser is set to 0 nm on the horizontal axis of FIG. 2A. It is understood that the active layer portion has a peek of the optical intensity distribution, thus exhibiting a substantially unimodal distribution.

Figure 2B:
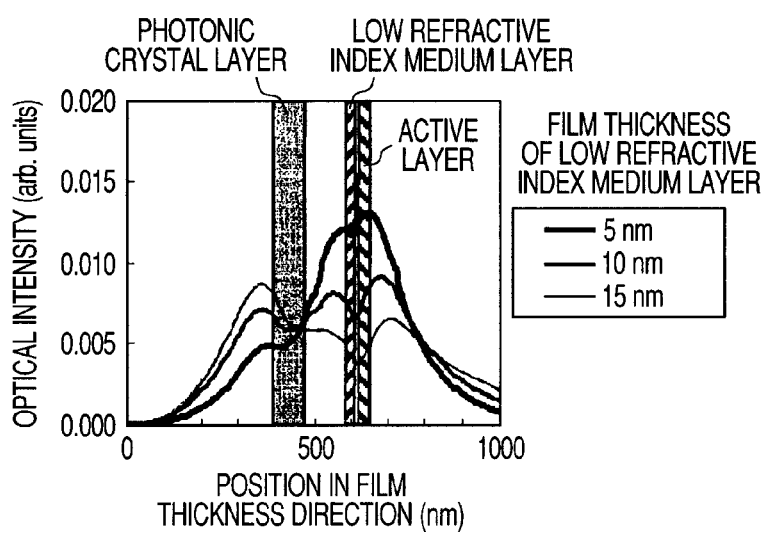

In contrast to this, FIG. 2B illustrates the calculation results when the low refractive index medium 121 is a uniform film thickness layer not having an aperture part according to the present embodiment, that is, in a state in which the low refractive index medium 121 is arranged close to an upper side of the active layer 114.

Here, the calculations were performed by changing the film thickness of the low refractive index medium 121. It is understood that in a state in which a layer of the low refractive index medium 121 is formed, the more the film thickness of the low refractive index medium 121 increases, the more the light distribution in the part of the active layer 114 decreases and the more the light distribution in the part of the two-dimensional photonic crystal 132 increases.

Note that the calculation results showed that when the film thickness of the low refractive index medium 121 was 20 nm or more, no optical waveguide mode was formed. For that reason, the film thickness of the low refractive index medium 121 is preferably less than 20 nm.

Figure 2C:
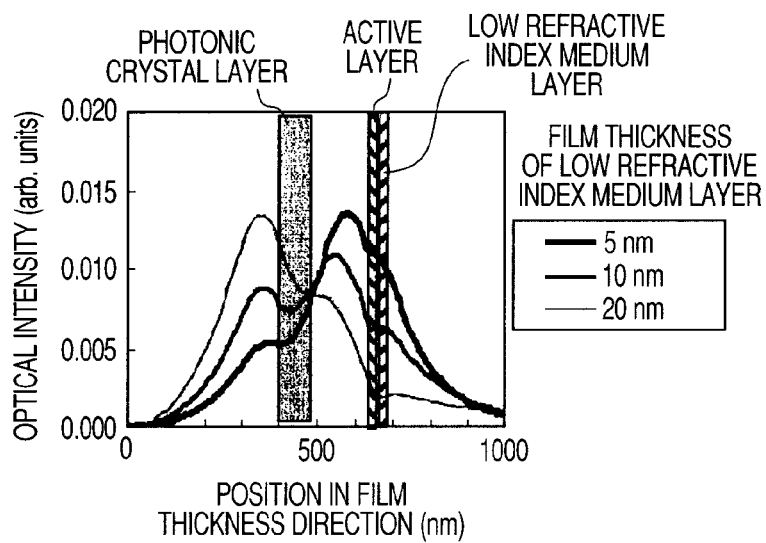

FIG. 2C illustrates the calculation results when the film thickness of the low refractive index medium 121 was changed in a state in which the low refractive index medium 121 was arranged close to the lower side of the active layer 114, that is, close to the opposite side of the two-dimensional photonic crystal 132 with respect to the active layer 114. It is understood that in comparison with the case in which the low refractive index medium 121 is formed immediately above the active layer 114, the more the film thickness of the low refractive index medium 121 increases, the more the light distribution of the part of the two-dimensional photonic crystal 132 increases.

Note that the calculation results showed that when the film thickness of the low refractive index medium 121 was 25 nm or more, no optical waveguide mode was formed. For that reason, the film thickness of the low refractive index medium 121 is preferably less than 25 nm.

This is because in comparison with the case in which a layer of the low refractive index medium 121 is not formed, in the present example, the effective refractive index of a part of two-dimensional photonic crystal 132 relatively increases with the decrease in the effective refractive index near the active layer 114.

It is understood from the above that in comparison with the case in which the layer of the low refractive index medium 121 is not formed, the present example has an effect that can reduce optical confinement to the active layer 114 and can increase optical confinement to the two-dimensional photonic crystal 132.

This can reduce optical absorption losses caused by an active layer serving as an absorbing layer in a peripheral portion of a light-emitting region of the surface emitting laser and can increase optical confinement to the two-dimensional photonic crystal, thereby improving the surface emitting laser characteristics.

Figure 3A:
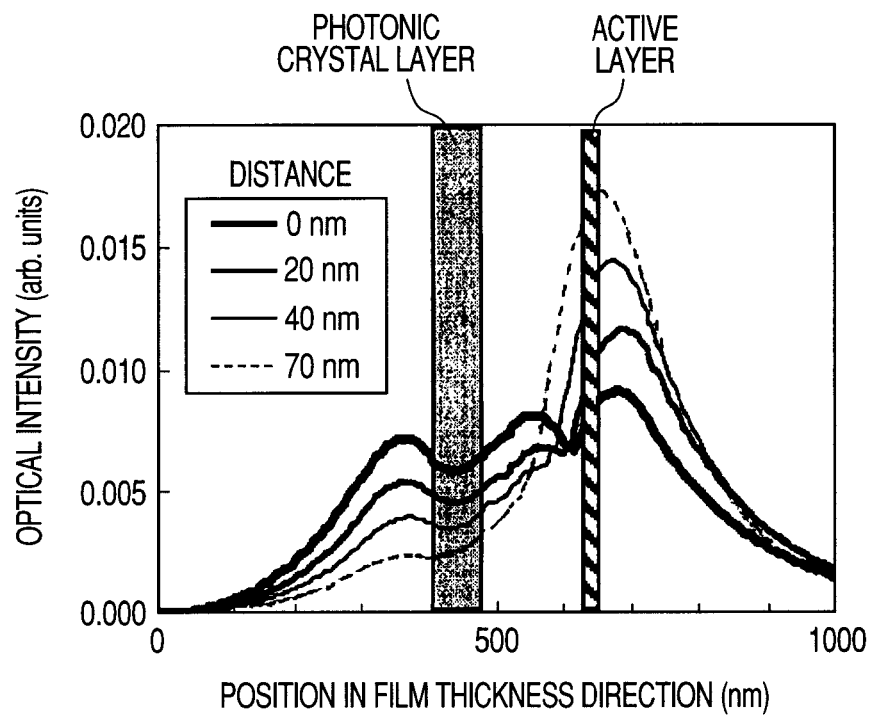
FIGS. 3A and 3B illustrate results of calculating the optical intensity distribution using a distance between the low refractive index medium and an active layer as a parameter according to an embodiment of the present invention.

Now, FIG. 3A illustrates the calculation results in the case in which the film thickness of the low refractive index medium 121 was set to 10 nm; the low refractive index medium 121 was placed on an upper side of the active layer 114, namely, the low refractive index medium 121 was interposed between the two-dimensional photonic crystal 132 and the active layer 114; and the distance between the layer of the low refractive index medium 121 and the active layer 114 was changed.

Figure 3B:
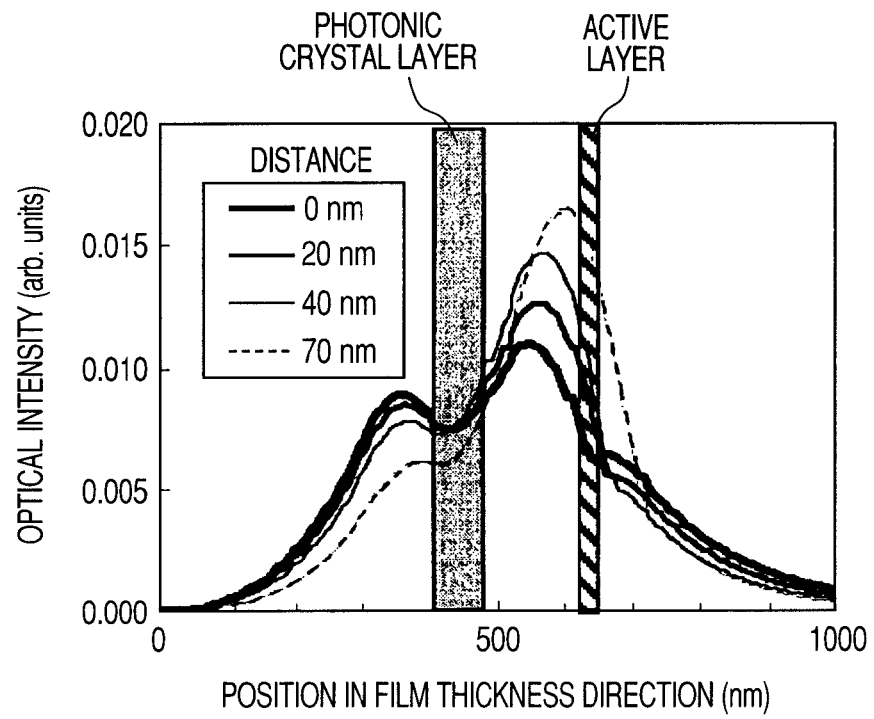

Further, FIG. 3B illustrates the calculation results in the case in which the layer of the low refractive index medium 121 was placed on a lower side of the active layer 114.

When the low refractive index medium 121 was placed on an upper side of the active layer 114, it is understood that the farther the distance between the low refractive index medium 121 and the active layer 114, the weaker the optical confinement in a part of the two-dimensional photonic crystal 132.

When the distance was 40 nm or more, it is understood that the optical confinement in a part of the two-dimensional photonic crystal 132 was weak in comparison with the case in which the layer of the low refractive index medium 121 was not formed as illustrated in FIG. 2A.

This is because when the distance is too far, the low refractive index medium 121 with a low refractive index serves as a barrier against light and reduces light distribution to the two-dimensional photonic crystal 132 side opposite to the active layer 114 when viewed from the low refractive index medium 121. Thus, when the low refractive index medium 121 is interposed between the two-dimensional photonic crystal 132 and the active layer 114, the distance between the low refractive index medium 121 and the active layer 114 is preferably in a range less than 40 nm.

In contrast to this, when the low refractive index medium 121 is placed opposite to the two-dimensional photonic crystal 132 with respect to the active layer 114, it is understood that the optical confinement in a part of the two-dimensional photonic crystal 132 is increased in comparison with the case in which the low refractive index medium 121 is interposed between the two-dimensional photonic crystal 132 and the active layer 114.

The optical confinement with a distance of 70 nm in the case in which the low refractive index medium 121 is placed on a lower side of the active layer 114 is 1.1 time of the optical confinement in the case of the closest arrangement (a distance of 0 nm) in which the optical confinement is a maximum when the low refractive index medium 121 is placed on an upper side of the active layer 114.

EXAMPLES

Hereinafter, examples of the present invention are described.

Example 1

In example 1, the surface emitting laser having a two-dimensional photonic crystal configured by applying the present invention is described using FIGS. 1A and 1B. The surface emitting laser 100 according to the present example includes a p-type guide layer 141 containing a two-dimensional photonic crystal 132, an active layer 114, an n-type cladding layer 112, an n-type contact layer 111, and electrodes 101 and 102. The p-type guide layer 141 containing the two-dimensional photonic crystal and the n-type contact layer 111 are made of a p-type and n-type GaN semiconductor layers respectively.

The active layer 114 is a multiple quantum well structure using a nitride semiconductor material. The well layer and the barrier layer of the quantum well structure are made of InGaN and GaN respectively. The band gap of the well layer is smaller than the band gap of the barrier layer and the p-type optical guide layer 141 containing the two-dimensional photonic crystal. The active layer 114 emits light by carrier injection. Note that the active layer 114 according to the present example is the multiple quantum well structure, but may be a single quantum well structure.

An n-type electrode 101 and a p-type electrode 102 each made of Au (gold) are formed on a rear surface of the n-type contact layer 111 and on the upper surface of the p-type contact layer 143 respectively. Note that the electrode material according to the present example is not particularly limited to Au, but may be other materials.

When a voltage is applied between the electrodes 101 and 102, a region of the active layer 114 in which a carrier is injected emits light. Then, the light released from the active layer 114 is incident on the two-dimensional photonic crystal 132.

The light matching a predetermined period of the photonic crystal 132 is diffracted repeatedly by the photonic crystal 132, which generates a standing wave and specifies a phase condition. The light whose phase is specified by the photonic crystal 132 is fed back to the light inside the active layer 114 by diffraction to generate a standing wave. The standing wave satisfies the optical wavelength and phase conditions specified by the photonic crystal 132.

Thus, the light resonates and is amplified in the photonic crystal 132, and coherent light is surface-emitted in a vertical direction to a surface of the photonic crystal 132.

The two-dimensional photonic crystal 132 is made of a photonic crystal periodic structure 131 arranged in a lattice shape.

Note that the photonic crystal periodic structure 131 according to the present example is preferably made of air allowing a large difference between the refractive index of air (refractive index of 1.0 for air) and the refractive index of the semiconductor layer (refractive index of 2.54 for GaN) forming the two-dimensional photonic crystal. However, the photonic crystal periodic structure 131 may be made of a dielectric material with a lower refractive index than that of the semiconductor forming the two-dimensional photonic crystal.

Examples of the dielectric material with a low refractive index forming the photonic crystal periodic structure 131 may include silicon dioxide (refractive index of 1.5) and silicon nitride (SiNO.

Hereinafter, a method of manufacturing the surface emitting laser 100 according to the present example is described.

First, as illustrated in FIG. 1B, the n-type cladding layer 112 made of n-type AlGaN, the optical guide layer 113 made of non-doped GaN, and the active layer 114 are laminated on the n-type contact layer 111 made of n-type GaN substrate in this order. Note that the material forming the optical guide layer 113 is not particularly limited to non-doped GaN, but may be n-type GaN.

After the active layer 114 is formed, the low refractive index medium 121 having an aperture part and made of silicon dioxide (refractive index of 1.5) or the like is selectively formed on the active layer 114. In order to do that, first, a resist having a circular pattern is formed on the active layer 114. Then, a silicon dioxide film is formed with a thickness of 10 nm, for example, using an electron beam deposition apparatus, a sputtering apparatus, or the like. Then, lift-off is performed to form the low refractive index medium 121 having a circular aperture part. Note that the shape of the aperture part is not particularly limited to a circle, but may be a hexagon, a quadrangle, or the like. Further, in order to improve optical confinement, the aperture part according to the present example is preferably closed, but is not particularly limited to this and may be opened.

Furthermore, the method of forming the low refractive index medium 121 according to the present example is not particularly limited to the above forming method, but, for example, a dry-etching process may be used. In this case, first, a silicon dioxide film is formed on the active layer 114.

Then, a resist mask is formed on the silicon dioxide film, a predetermined pattern is formed, and dry-etching is performed. Thus, the layer of the low refractive index medium 121 is completed. Note that the film thickness of the low refractive index medium 121 according to the present example is not particularly limited to 10 nm, but may be less than 20 nm, that is, the film thickness may be in a range in which a waveguide mode is formed in a waveguide containing the two-dimensional photonic crystal 132.

Then, a thin film semiconductor layer is grown on the active layer 114 on which the low refractive index medium 121 is formed by the MOCVD process or the MBE process as follows. More specifically, predetermined growth conditions for promoting lateral growth are set such as a growth pressure of 300 Ton and a growth temperature of 1050° C.

Then, the optical guide layer 122 made of non-doped GaN is grown so as to bury the low refractive index medium 121 from a place in which the low refractive index medium 121 is not formed. Note that the material forming the optical guide layer 122 is not particularly limited to non-doped GaN, but may be p-type GaN.

Note that in order to improve optical confinement, the low refractive index medium 121 according to the present example is preferably arranged close to the active layer 114. However, the present example is not particularly limited to this, but may be arbitrarily set in a range less than 40 nm, or in a range in which the optical confinement to the two-dimensional photonic crystal 132 is increased.

In this case, the active layer 114 is formed and a thin film semiconductor layer made of, for example, non-doped GaN is grown with a necessary film thickness. Thus, the distance between the low refractive index medium 121 and the active layer 114 can be arbitrarily set by forming the low refractive index medium 121 after part of the optical guide layer 122 is formed. Note that the low refractive index medium 121 according to the present example is not particularly limited to silicon dioxide, but may be any medium having a refractive index higher than the refractive index of air and lower than the refractive index of the guide layer 122. For example, silicon nitride film ($SiN_x$), $MgF_2$, $CaF_2$, $BaF_2$, $Al_2O_3$, LiF, and like may be used.

The formation of the layer of the low refractive index medium 121 made of the above media including silicon dioxide is also expected to have a secondary effect of suppressing diffusion of In atoms constituting the active layer 114 toward the optical guide layer 122 side by internal diffusion during crystal growth. In other word, the low refractive index medium 121 serves as an internal diffusion suppressing layer.

Likewise, the formation of the layer of the low refractive index medium 121 is also expected to have another secondary effect of suppressing internal diffusion of Mg atoms constituting the p-type guide layer 141 made of p-type GaN toward the active layer 114 side.

Then, the electron blocking layer 123 made of p-type AlGaN is grown.

Subsequently, a thin film semiconductor layer forming the two-dimensional photonic crystal 132 is grown. More specifically, a thin film semiconductor layer made of, for example, p-type GaN is grown with a film thickness corresponding to the height of the photonic crystal periodic structure 131.

Then, a two-dimensional photonic crystal-shaped resist having a resonance mode in an in-plane direction is formed on the thin film semiconductor layer so as to be arranged two-dimensionally and periodically in the in-plane direction by electron beam exposure.

Then, the thin film semiconductor layer is dry-etched by using the resist as a mask. Subsequently, the two-dimensional photonic crystal 132 is formed by removing the resist. Here, it is assumed that a resonant wavelength and a lattice constant of the two-dimensional photonic crystal 132 are "$\lambda$" and "a" respectively; and an effective refractive index of a waveguide containing the two-dimensional photonic crystal 132 is $n_{eff}$. In order to improve the surface emitting laser characteristics, it is more preferable that the crystal periodic structure 131 is formed by adjusting lattice constant "a" so as to make $\lambda = a \times n_{eff}$ constant regardless of the position of the two-dimensional photonic crystal 132.

According to the present example, the description has been given to a case of forming the two-dimensional photonic crystal 132 by dry-etching using the resist as a mask.

However, for example, silicon dioxide may be used as the mask. More specifically, a silicon dioxide film is formed and then a two-dimensional photonic crystal-shaped resist having a resonance mode in an in-plane direction is formed on the silicon dioxide film so as to be arranged two-dimensionally and periodically in the in-plane direction.

Then, the silicon dioxide film is dry-etched by using the resist as a mask. Thereby, a silicon dioxide film with a shape of the two-dimensional photonic crystal is formed. Subsequently, the two-dimensional photonic crystal 132 may be formed by dry-etching the thin film semiconductor layer using the silicon dioxide film as a mask.

Then, predetermined growth conditions for promoting lateral growth are set such as a growth pressure of 300 Ton and a growth temperature of 1150° C.

Then, the optical guide layer 141 containing the two-dimensional photonic crystal 132 is formed by laminating the thin film semiconductor layer made of p-type GaN so as to cover the photonic crystal periodic structure 131 made of a hole. Here, it is more preferable that the photonic crystal periodic structure 131 is a hole (gas, such as a state in which air is buried) which can increase the difference in refractive index with respect to a semiconductor layer constituting the two-dimensional photonic crystal 132. More strictly stated, it is more preferable that the photonic crystal periodic structure 131 is in a state in which there is a gas contained in an environment in crystal growth.

However, the hole may be filled with a medium having a lower refractive index than that of the semiconductor constituting the two-dimensional photonic crystal 132, such as silicon dioxide and silicon nitride. In this case, the two-dimensional photonic crystal 132 is formed by forming the photonic crystal periodic structure 131 made of, for example, silicon dioxide and then laminating the thin film semiconductor layer made of p-type GaN so as to bury the photonic crystal periodic structure 131.

Note that according to the present example, the position of the two-dimensional photonic crystal 132 in the optical guide layer 141 can be arbitrarily set. In this case, a thin film semiconductor layer is laminated by adding a film thickness required to move the position of the two-dimensional photonic crystal 132 upward. Thus, the position can be arbitrarily set by forming the two-dimensional photonic crystal 132 afterward.

Then, the p-type cladding layer 142 made of p-type AlGaN and the p-type contact layer 143 made of p-type GaN are laminated in this order.

Then, the n-type electrode 101 and the p-type electrode 102 are formed on the respective surfaces of the n-type contact layer 111 and the p-type contact layer 143. Thus, the surface emitting laser 100 is completed. Here, in order to further improve surface emitting laser characteristics, it is more preferable that the p-type electrode 102 is formed inside the orthographic projection area of the aperture of the low refractive index medium 121. However, the p-type electrode 102 is not particularly limited to this, but may be of a size enough to extract a laser beam resonating in the two-dimensional photonic crystal 132 outside from the periphery of the p-type electrode 102.

Further, according to the present example, the p-type cladding layer and the p-type contact layer are formed, but the present example is not particularly limited to the formation of these layers and these layers may not be formed. In this case, the atmosphere (air) contacting a surface of the p-type optical guide layer containing the two-dimensional photonic crystal serves as the cladding layer. This can suppress the increase in internal resistance by the p-type cladding layer made of p-type AlGaN having a higher resistance than that of p-type GaN.

For this reason, the drive voltage of the surface emitting laser can be reduced in comparison with the case in which the p-type cladding layer is formed.

Note that according to the present example, the description has been directed to a case of using an n-type GaN substrate as the n-type contact layer 111. However, according to the surface emitting laser of the present invention, the formation of the n-type contact layer 111 is not particularly limited to the use of an n-type GaN substrate. For example, instead of the n-type GaN substrate, an n-type SiC substrate may be used.

Further, a GaN buffer layer made of GaN for dislocation reduction is formed on a sapphire substrate through a strained buffer layer by the MOCVD process, on which an n-type GaN layer is formed and may be used as the n-type contact layer. In this case, the strained buffer layer is thermally dissolved by the laser lift-off process, and the sapphire substrate is removed, and then the n-type electrode is formed.

Further, the method of forming the n-type electrode is not particularly limited to the above forming method, but another method may be used. For example, without removing the sapphire substrate, part of the n-type GaN layer is exposed from the surface side of the surface emitting laser by a dry-etching process, and there the n-type electrode may be formed.

Furthermore, instead of the sapphire substrate, a silicon substrate or the like may be used. In this case, a GaN buffer layer made of GaN for dislocation reduction is formed on the silicon substrate through a strained buffer layer by the MOCVD process, on which an n-type GaN layer may be formed and used as the n-type contact layer.

Note that when n-type silicon is used in the silicon substrate, an n-type electrode may be formed on a rear surface of the n-type silicon substrate, thereby eliminating the need to remove the substrate.

Now, by using FIG. 4, another configuration example according to the present example is described. Note that in FIG. 4, the same reference numerals or characters are assigned to the components which are the same as or similar to those in FIG. 1B, and here the description focuses on only the differences from FIG. 1B.

In FIG. 4, a two-dimensional photonic crystal surface emitting laser 400 includes a low refractive index medium 421, an active layer 414, a p-type optical guide layer 441 containing a two-dimensional photonic crystal 432 made of a photonic crystal periodic structure 431 arranged in a lattice shape.

According to the present example, as illustrated in FIG. 1B, the low refractive index medium having an aperture part is formed with a constant film thickness regardless of its position. However, as illustrated in FIG. 4, the low refractive index medium 421 may be formed in a configuration that the layer thickness thereof is gradually thicker from the central region side to the outer peripheral portion side.

In this case, the effective refractive index of the waveguide containing the two-dimensional photonic crystal 432 does not change sharply at an interface of the aperture part, but gradually changes. This can suppress mismatch of the waveguide at an interface of the aperture part. For that reason, the surface emitting laser characteristics are expected to improve.

Further, according to the present example, the low refractive index medium is formed by depositing a layer made of a low refractive index medium, but the present example is not particularly limited to the above forming method. For example, the low refractive index medium may be formed by ion implantation. In this case, by referring to FIG. 1B, the active layer 114 is formed and then, for example, a p-type GaN layer with a thickness of the set low refractive index medium is laminated.

Then, like the same configuration as that of the present example, boron (B), for example, is ion-implanted into a peripheral portion of a light-emitting region of the surface emitting laser 400 with a predetermined accelerating voltage and implantation amount. This can reduce the refractive index of a layer made of p-type GaN of the peripheral portion of the light-emitting region and thereby a layer of low refractive index medium is formed.

Here, the ion-implanted atom is not particularly limited to boron (B), but, for example, aluminum (Al) which can reduce the refractive index may be used. Note that the ion implantation is not particularly limited to a uniform condition irrespective of the position in which the ion is implanted, but the ion implantation condition may be changed by the position. For example, the ion implantation condition may be changed in such a manner that the refractive index of the peripheral portion made of a low refractive index medium formed by ion implantation becomes gradually lower from the central region side to the outer peripheral portion side.

This can suppress mismatch of a waveguide containing the two-dimensional photonic crystal 132 in comparison with the above method of ion implanting under a specific condition regardless of the position.

For that reason, the surface emitting laser characteristics are expected to improve.

Example 2

Figure 5:
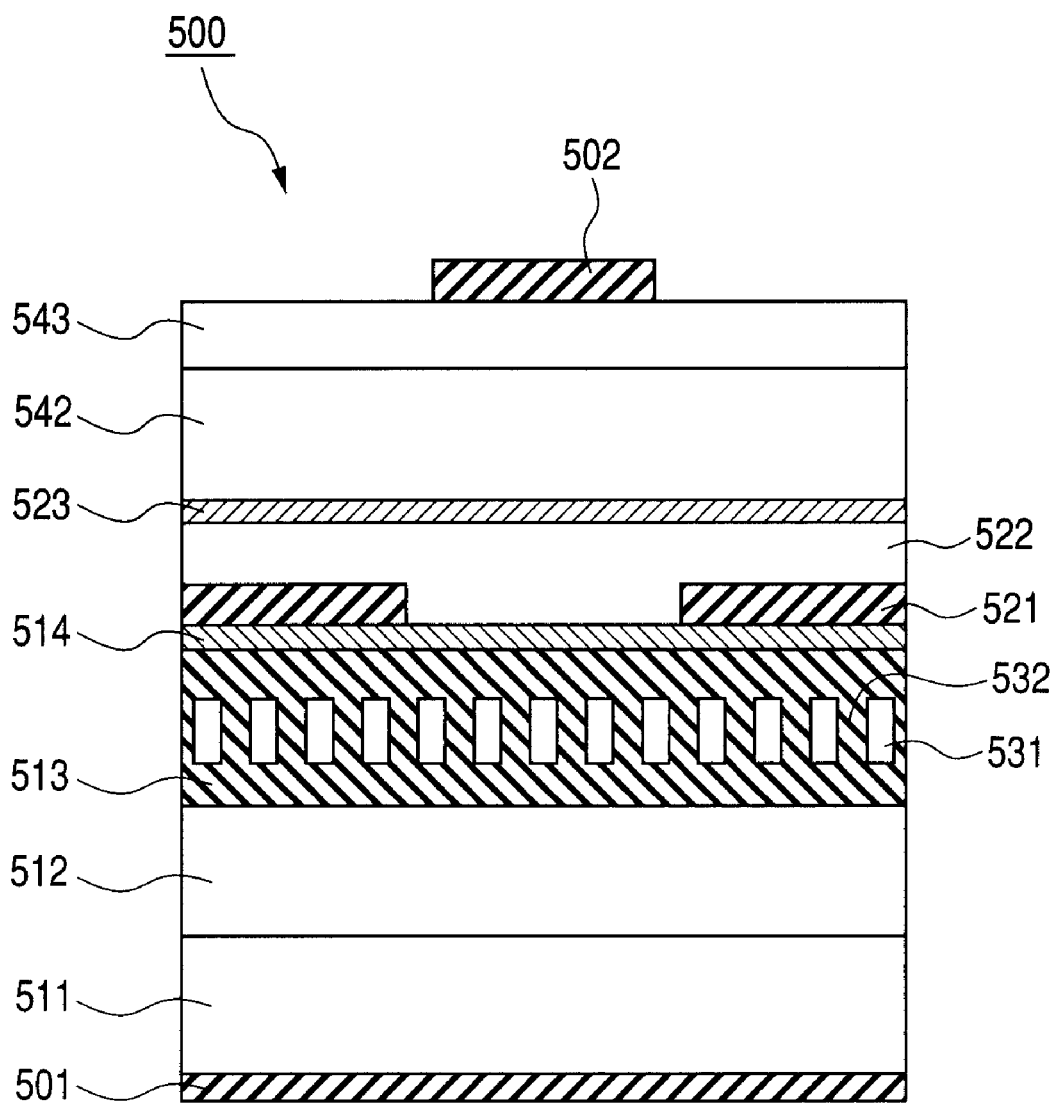
FIG. 5 is a sectional view describing a two-dimensional photonic crystal surface emitting laser according to example 2 of the present invention.

Unlike the example 1, according to the example 2, by referring to FIG. 5, the description focuses on a two-dimensional photonic crystal surface emitting laser in which a low refractive index medium is arranged on an opposite side of a two-dimensional photonic crystal with respect to an active layer.

In FIG. 5, a surface emitting laser 500 includes electrodes 501 and 502, a base and contact layer 511, a lower cladding layer 512, an active layer 514, and a guide layer 513 containing a two-dimensional photonic crystal. The surface emitting laser 500 further includes a two-dimensional photonic crystal 532, a photonic crystal periodic structure 531, and a low refractive index medium 521.

Hereinafter, a method of manufacturing the surface emitting laser 500 according to the present example is described.

First, in the same configuration as that of example 1 illustrated in FIGS. 1A and 1B, up to the lower cladding layer 512 is formed. Then, using n-type GaN by the same manufacturing method as that of example 1, the n-type guide layer 513 containing the two-dimensional photonic crystal 532 is formed and then the active layer 514 is grown. Then, by the same manufacturing method as that of example 1, the low refractive index medium layer 521 having an aperture part, the p-type optical guide layer 522 made of p-type GaN, and the electron blocking layer 523 made of p-type AlGaN are laminated on the active layer 514 in this order.

Then, in the same configuration as that of example 1, the p-type cladding layer 542 made of p-type AlGaN, the p-type contact layer 543 made of p-type GaN, the n-type electrode 501, and the p-type electrode 502 are formed. Thus, the surface emitting laser 500 is completed.

In comparison with example 1, the present example forms the active layer 514 after dry-etching is performed to form the two-dimensional photonic crystal 532 and thus can suppress damage to the active layer 514 caused by dry-etching.

Here, it is preferable that the film thickness of the low refractive index medium 521 according to the present example is 20 nm which increases the optical confinement to the two-dimensional photonic crystal 532. However, the present example is not particularly limited to this, but may be less than 25 nm, that is, of a film thickness in a range in which a waveguide mode is formed in the waveguide containing the two-dimensional photonic crystal 532. Further, the low refractive index medium 521 may have the same configuration as that of example 1, such that the peripheral portion made of a low refractive index medium becomes gradually thicker from the central region side to the outer peripheral portion side.

Furthermore, the low refractive index medium 521 may be formed by ion implantation by the same manufacturing method as that of example 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-279087, filed Dec. 9, 2009, which is hereby incorporated by reference herein in its entirety.

What is claimed is:

1. A two-dimensional photonic crystal surface emitting laser having a laminated structure in which an active layer and a photonic crystal layer having a structure of a photonic crystal are laminated on a substrate, and having an electrode for injecting a carrier in said active layer, wherein said electrode is provided in a central region of a surface of said laminated structure, having a resonance mode in an in-plane direction of the photonic crystal, and extracting light in a vertical direction to a surface of the photonic crystal, wherein said laminated structure has a multi-refractive index layer including a central region made of a high refractive index medium and a peripheral portion made of a low refractive index medium with a lower refractive index than that of said high refractive index medium, and wherein a peripheral portion made of a low refractive index medium in said multi-refractive index layer is formed in a region not overlapped with the electrode.

2. The two-dimensional photonic crystal surface emitting laser according to claim 1, wherein said multi-refractive index layer is formed between said photonic crystal layer and said active layer.

3. The two-dimensional photonic crystal surface emitting laser according to claim 1, wherein said multi-refractive index layer is formed on an opposite side of the two-dimensional photonic crystal with said active layer sandwiched therebetween.

4. The two-dimensional photonic crystal surface emitting laser according to claim 1, wherein said electrode is a p-type electrode.

5. The two-dimensional photonic crystal surface emitting laser according to claim 1, wherein a peripheral portion made of a low refractive index medium in said multi-refractive index layer has such a layer configuration that a layer thickness becomes gradually thicker from the central region side to an outer peripheral portion side.

6. The two-dimensional photonic crystal surface emitting laser according to claim 1, wherein a peripheral portion made of a low refractive index medium in said multi-refractive index layer has such a layer configuration that a refractive index thereof becomes gradually lower from the central region side to an outer peripheral portion side.

7. The two-dimensional photonic crystal surface emitting laser according to claim 1, wherein a low refractive index medium in said multi-refractive index layer is made of an insulation medium.

8. The two-dimensional photonic crystal surface emitting laser according to claim 1, wherein said photonic crystal layer is made of a nitride semiconductor.

* * * * *